United States Patent [19]

Buford

[11] Patent Number: 4,673,882
[45] Date of Patent: Jun. 16, 1987

[54] MAGNETIC SYSTEM FOR NUCLEAR MAGNETIC RESONANCE DIAGNOSTIC DEVICE

[76] Inventor: J. Philip Buford, 513 N. Boston Ave., De Land, Fla. 32724

[21] Appl. No.: 586,808

[22] Filed: Mar. 6, 1984

[51] Int. Cl.⁴ .......................................... G01R 33/20
[52] U.S. Cl. ................................... 324/320; 324/318; 335/298
[58] Field of Search ............... 324/318, 319, 320, 228; 335/298, 302, 306, 284, 209, 212; 336/134; 365/2, 27, 28; 128/653

[56] References Cited

U.S. PATENT DOCUMENTS

| | | | |
|---|---|---|---|
| 2,917,682 | 12/1959 | Kirchner et al. | 335/212 |
| 3,018,422 | 1/1962 | Seaton | 335/298 |
| 3,030,556 | 4/1962 | Watson | 335/298 |
| 3,178,602 | 4/1965 | Meixner | 335/211 |
| 3,296,569 | 1/1967 | Ikegami et al. | 335/209 |
| 3,406,333 | 10/1968 | Nelson | 324/320 |
| 3,412,352 | 9/1968 | Watson | 335/298 |
| 3,419,904 | 12/1968 | Weaver et al. | 361/141 |
| 3,510,832 | 5/1970 | Golay | 324/320 |
| 3,730,687 | 5/1973 | Rondeau | 324/307 |
| 4,021,763 | 5/1977 | Steingroever | 335/303 |
| 4,048,555 | 9/1977 | Rupp, Jr. et al. | 324/320 |
| 4,093,912 | 6/1978 | Double et al. | 324/320 |
| 4,122,386 | 10/1978 | Tomita et al. | 324/320 |
| 4,153,948 | 5/1979 | Dimyan | 365/2 D |
| 4,173,775 | 11/1979 | Kneip, Jr. | 324/320 |
| 4,231,008 | 10/1980 | Krueger | 324/320 |
| 4,284,950 | 8/1981 | Burl et al. | 324/320 |
| 4,320,342 | 3/1982 | Heinzerling | 324/320 |
| 4,329,646 | 5/1982 | Tsuda | 324/307 |
| 4,339,718 | 7/1982 | Bull et al. | 324/320 |
| 4,362,993 | 12/1982 | Young et al. | 324/309 |
| 4,636,756 | 1/1987 | Ito et al. | 335/298 X |

FOREIGN PATENT DOCUMENTS 0060346  4/1984  Japan ..................... 324/307

Primary Examiner—Stewart J. Levy
Assistant Examiner—Scott M. Oldhan
Attorney, Agent, or Firm—Haight & Hofeldt

[57] ABSTRACT

An adjustable magnetic field for nuclear magnetic resonance diagnostic devices is provided by a set of extending ferromagnetic bars mounted in one of a pair of opposing magnetic pole members. A second set of extending ferromagnetic bars may be mounted in the other magnetic pole opposite the first set of bars. Adjustment of the magnetic field may be achieved either by moving the ferromagnetic bars or by controlling current flow through coils placed about at least some of the ferromagnetic bars. In order to detect the actual field strength and configuration to provide for the requisite control signals, an array of Hall effect detectors is employed.

18 Claims, 4 Drawing Figures

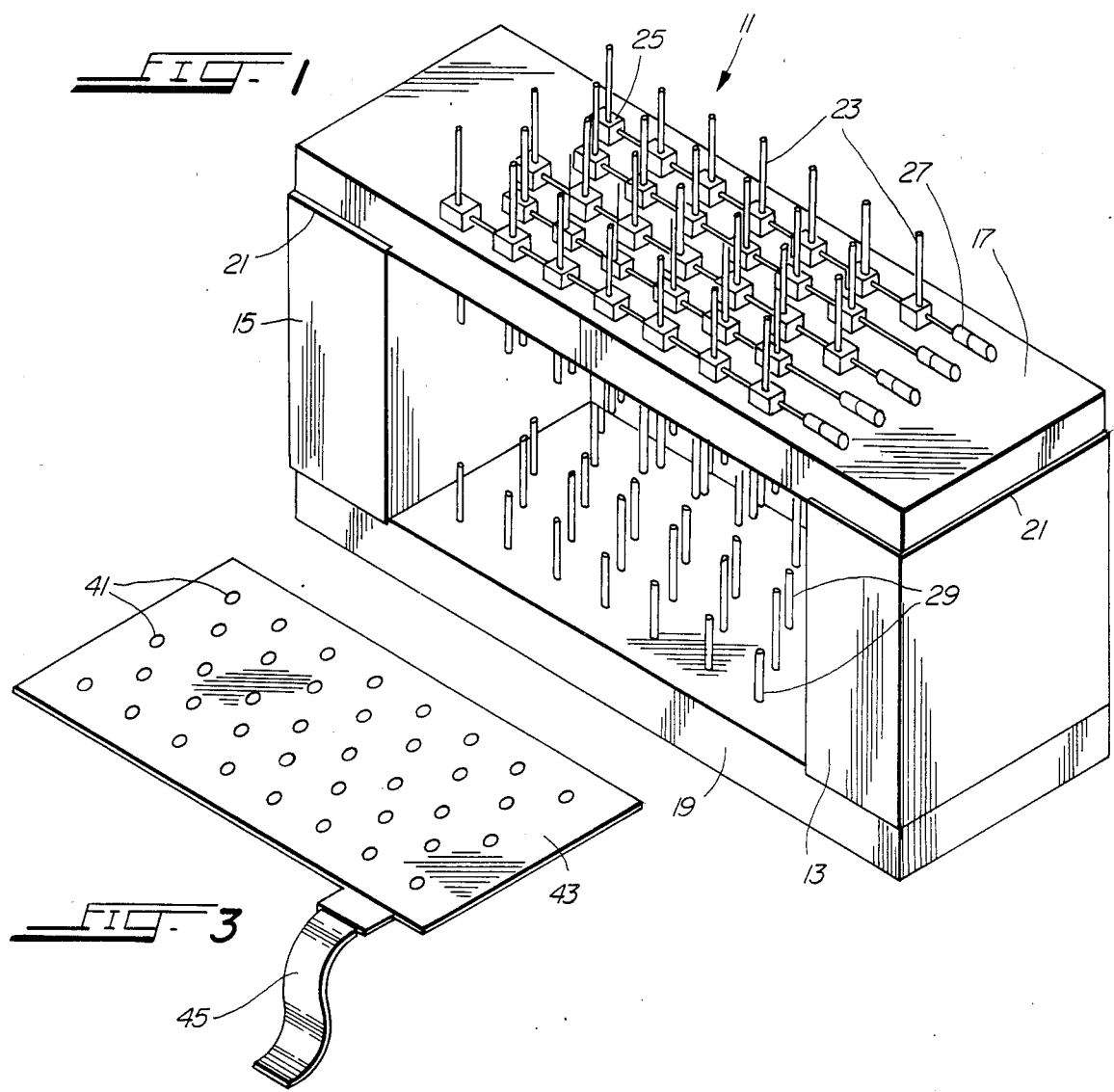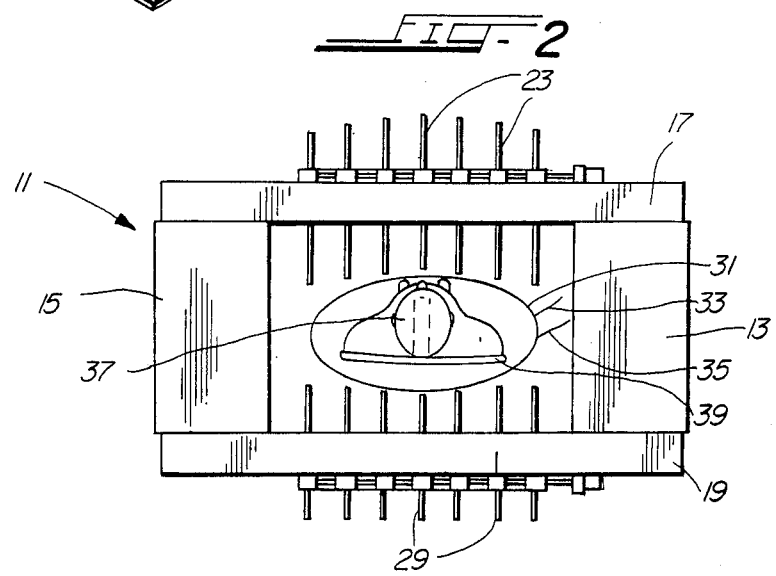

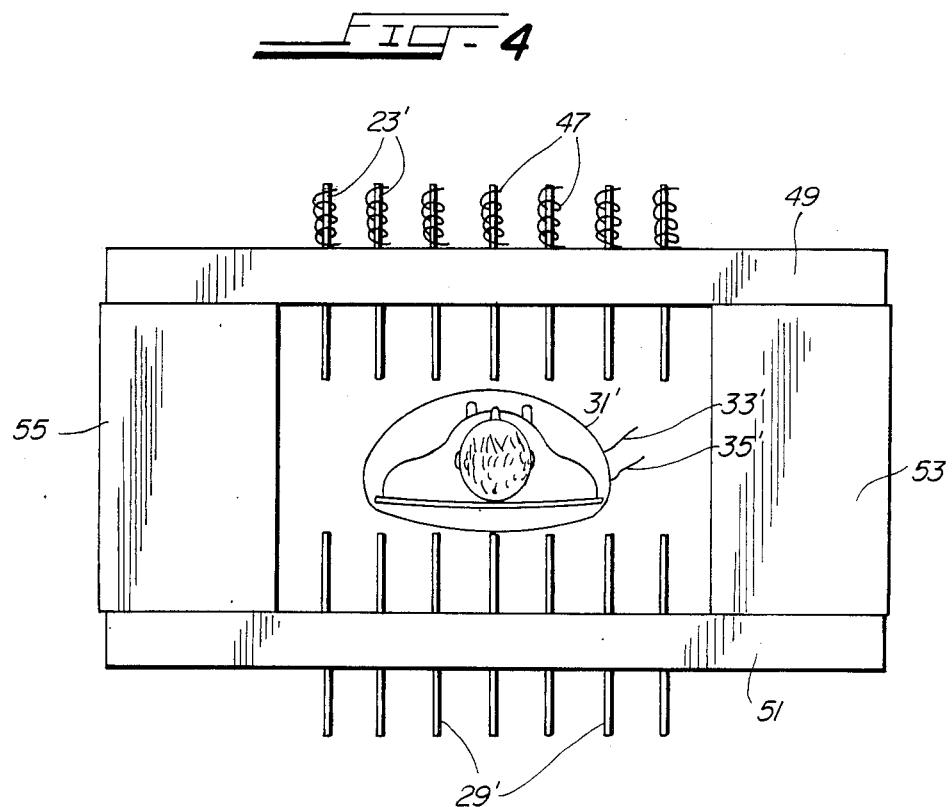

MAGNETIC SYSTEM FOR NUCLEAR MAGNETIC RESONANCE DIAGNOSTIC DEVICE

BACKGROUND OF THE INVENTION

1. Field of the Invention

This invention relates generally to an adjustable magnetic system for producing a desired magnetic field strength and configuration, and more specifically, this invention relates to a magnetic system to produce a desired magnetic field strength and configuration for a nuclear magnetic resonance diagnostic device.

2. Description of the Prior Art

Although nuclear magnetic resonance (NMR) techniques have been known and utilized for several decades in analyzing various types of materials, it is only within the last few years that extensive efforts have resulted in the use of NMR techniques for analyzing various parts of the human body. As a diagnostic tool, NMR is a valuable supplement to currently utilized X-ray and ultrasonic non-invasive techniques. In addition, since NMR can provide much greater information about soft tissue than either X-ray or ultrasonic scanning, it has the capability of replacing invasive diagnostic techniques ranging from the consumption of radioactive materials to surgical incisions. Further, since bone does not provide an impediment to magnetic fields, there are certain imaging tasks that NMR can perform, such as looking at the spinal cord or cartilage inside the vertebrae, that cannot be accomplished with X-ray or ultrasonic techniques and which may be extremely dangerous or even impossible for invasive techniques. On top of these advantages, magnetic fields produce no known adverse effects in the body, although the extent to which field strength can be increased without producing such adverse effects may be questioned.

NMR diagnosis is achieved by placing the patient (or other object being analyzed) in a uniform relatively strong fixed magnetic field. The required strength of this field has not been adequately established as of this time. It appears that three kilogauss or less will produce very good imaging for the hydroxyl group. However, certain significant elements in body tissue, such as phosphorus, may require significantly stronger fields, although it appears that the great majority of metabollic states and functions that can be examined by NMR techniques do not require these very high field strengths.

The purpose of the relatively strong magnetic field is to produce an alignment of the atomic nuclei of the element of the body being analyzed. Due to the large amount of water in the body, much information can be obtained by observing the hydrogen nucleus or proton. Thus, it is the hydroxyl group that is of most practical benefit in NMR diagnostic techniques.

After the relatively large fixed magnetic field has established an alignment of the atomic nuclei, a radio frequency magnetic field (RF field) perpendicular to the fixed field is applied. This RF field effects the orientation of the atomic nuclei established by the relatively strong fixed magnetic field, the extent of which depends upon the particular element being observed. The RF field is then removed and the reaction of the atomic nuclei produces a magnetic effect that is picked up and analyzed to yield the desired information. Analysis of the magnetic signals is achieved by use of image processing computer technology largely derived from programs and equipment used in the well-known CAT (computerized axial tomography) scanners, which utilize X-ray beams to develop cross-sectional views of the body.

At the present time, most NMR diagnostic imaging devices have utilized solenoidal superconducting magnets for the relatively large constant magnetic field, which must provide a considerable degree of homogeneity across the area in question. The superconducting magnets utilize electrical currents circulating in coils formed of special metal alloys that display virtually no electrical resistance when maintained at temperatures near absolute zero. As a result, very large electrical currents may be passed through the coils, with the production of attendant very large magnetic fields across an air gap sufficiently large to hold a human body.

While the solenoidal superconducting magnets can provide the necessary magnetic field strength for successful NMR imaging, it is difficult and time consuming to obtain and maintain the necessary field uniformity, as well as being difficult and expensive to contain and minimize the undesired relatively large "fringe fields" produced by these magnets. These extraneous or fringe fields produced by the solenoidal superconducting magnets can be over 30 feet in diameter and more than 120 feet long. These large fringe fields are potentially dangerous to patients with pacemakers, metal implants or surgical clips; and these fields can interfere with the operation of computers and other electronic equipment. Also, since variations in the fringe field will affect the field in the diagnostic area, automobiles, elevators, trash bins or even a metal file cabinet within 60 feet of the unit can distort the magnetic field in the NMR device. Such distortion requires that the magnetic system be re-calibrated or re-shimmed to provide the necessary uniformity or homogeneity of the magnetic field in the diagnostic area. The delicate nature of the balance of forces that produces field homogeneity makes the superconducting NMR device particularly susceptible to damage or to distortion requiring re-calibration in the event of vibrations or shocks to the equipment.

An additional problem with superconducting magnets is that the conducting coils must be maintained near absolute zero (approximately −460° Fahrenheit) in order to retain the superconducting characteristics. This requires the provision of equipment and procedures for inserting liquid nitrogen and/or helium and handling the resulting gases that boil off. The annual cost of the liquid helium and/or liquid nitrogen in a typical NMR installation will run from $50,000 to $100,000 or more. Thus, superconducting magnets involve not only the technical difficulties of maintaining cryogenic temperatures, but they also involve an ongoing relatively high expense factor.

Various attempts have been made to overcome the problems associated with superconducting magnet NMR diagnostic devices. In some cases, a separate building is constructed of wood and other non-magnetic materials and is located in an area which can be isolated from the hazards and problems referred to above. Such a structure can easily run into costs in the range of $500,000 to $1,000,000. Attempts to avoid the cost and space factors involved in such a separate structure have included surrounding the NMR area with one-inch thick steel plates, or by placing the entire NMR magnet assembly in a thick steel pipe 10 to 15 feet in diameter.

In view of the difficulties associated with superconducting magnetic assemblies, other alternatives have been explored. Electromagnets (commonly referred to as "resistive") have been tried, but it has been found that these electromagnets require very careful temperature control. In addition, they consume very large amounts of electrical energy and can generate electrical "noise" which adversely affects image quality.

Permanent magnets have many desirable attributes for NMR applications, but until recently it was thought that permanent magnets were too weak and uncontrollable for serious consideration. However, a working NMR diagnostic device has been developed utilizing a permanent magnet. Unfortunately, in order to get the requisite field strength, this system weighs on the order of 100 tons. Such a very heavy weight creates housing and support problems, with the attendant large costs. In addition, the problems associated with achieving the desired magnetic field homogeneity, while yet providing flexibility for varying circumstances, still exist.

SUMMARY OF THE INVENTION

With the present invention many of the problems plaguing the magnetic systems of NMR devices may be minimized or eliminated. While this approach is particularly applicable for permanent magnet structures, it can also be used to enhance the performance of superconducting and resistive electromagnets.

The present invention employs a pair of magnetic members or pole pieces mounted opposite one another, with the air gap in which the object being analyzed is to be placed is formed therebetween. While the present invention may be utilized to adjust magnetic field strength and configuration in many applications, including NMR analyses not directed to living tissue diagnoses, the following description will be in terms of an NMR diagnostic device. Also, it should be noted that the principles of this invention could be utilized in smaller devices for diagnosing only a portion of the human body. However, the description of the preferred embodiments will be in terms of the currently conventional NMR diagnostic devices in which the entire human body is inserted into the magnetic structure.

The magnetic members or pole pieces are energized by a suitable source or sources of magnetic energy. In a preferred embodiment, a pair of permanent magnets are located on either side of the air gap transverse to the pole pieces. The permanent magnets are aligned so that one of the magnetic members is established as a north pole, while the other magnetic member is established as a south pole. This establishes a primary path for magnetic flux flow through the air gap, where the patient is located.

A set of elongated ferromagnetic bars is mounted in at least one of the pole pieces, but in the preferred embodiments disclosed herein, a set of elongated ferromagnetic bars is mounted in each of the pole pieces. Each of these ferromagnetic bars is elongated to extend through its associated pole piece, and each of the ferromagnetic bars is mounted for individual longitudinal movement.

The ferromagnetic bars may be formed of any suitable ferromagnetic material and in any desired shape, although substantially round rods may be the most desirable, as shown in the preferred embodiments disclosed herein. The ferromagnetic bars should be mounted in the pole plate in such a fashion as to facilitate magnetic flux flow between the pole plates and the bars. In order to aid in the magnetic flux flow between the pole pieces and the bars, a suitable ferro-fluid may be located about the ferromagnetic bars where they pass through the pole plates to minimize the magnetic reluctance between the pole plates and the bars.

In order to be able to adjust for a variety of factors that could affect the magnetic field in the air gap, it is desirable to have a relatively large concentration of ferromagnetic bars mounted in each of the ferromagnetic members, such as to approximate the "pixels" of discrete information utilized in imaging devices, such as a television screen. The ratio of magnetic bars to magnetic member area will depend upon the size of the bars utilized and the degree of control or "fine tuning" required.

Control of the magnetic field in the air gap to produce the desired uniformity and strength requires some way of adjusting the magnetic flux flow through each of the individual ferromagnetic bars. In the first of the preferred embodiments disclosed herein, such adjustment is achieved by physically moving the magnetic bars along their longitudinal axis, thus varying the air gap between opposing bars. By so manipulating each of the bars, the desired magnetic field configuration may be achieved. In this preferred embodiment, the driving means for the individual magnetic bars has been schematically depicted as a plurality of eletromagnetic motors, although any suitable type of controllable driving devices, such as pneumatic or hydraulic devices, would be equally applicable.

Some way of detecting the magnetic field strength at the desired location in the air gap is necessary, in order to determine the requisite adjustment in positioning of the magnetic bars. While any suitable detector could be utilized, in the preferred embodiment disclosed herein an array of Hall effect detectors is employed. The output of the Hall effect detectors is conveyed to a computer for adjusting the positioning of the bars to give the desired field configuration. As the computer for controlling the adjustment of the magnetic bars could be the same computer utilized in producing images from the NMR signals, no additional computer hardware would be required.

In another embodiment, the adjustment of the magnetic flux flow through the individual ferromagnetic bars may be regulated by electromagnetic coils placed about the individual ferromagnetic bars. These electromagnetic coils could either be the sole source of adjustment, in which case the ferromagnetic bars would be permanently mounted in non-magnetic members that would replace the magnetic members, or as an addition to the adjustment achieved by physical displacement of the magnetic bars. In the case where the current flow through the electromagnetic coils is the sole source of adjustment of the magnetic field in the air gap, these coils would have to provide all of the magnetic energy, and thus there would be no separate source of magnetic energy.

With this structure, the desired magnetic field strength and uniformity may be achieved for NMR imaging, or any other suitable application of magnetic energy. With specific reference to NMR applications, this invention would permit the utilization of relatively low weight permanent magnet systems with all the attendant advantages over superconducting or eletromagnetic NMR magnetic systems. The ability to quickly re-adjust the magnetic field configuration permits elimination of the costly and time consuming field modifications required if a superconducting NMR system encounters any field disruption. Even if it is desired to utilize a superconducting magnet to achieve very high field strengths, this invention can be utilized in connection therewith to improve the operation of the superconducting system. However, the greatest applicability for the present invention would appear to be in the area of providing a practical and realizable use of permanent magnet systems for NMR imaging.

These and other objects, advantages and features of this invention will hereinafter appear, and for purposes of illustration, but not of limitation, exemplary embodiments of the subject invention are shown in the appended drawing.

BRIEF DESCRIPTION OF THE DRAWING

FIG. 1 is a perspective schematic view of a permanent magnet system constructed in accordance with the present invention.

FIG. 2 is a schematic front view of the system of FIG. 1 utilized for NMR imaging.

FIG. 3 is a perspective schematic view of an array of Hall effect detectors for utilization in connection with the magnetic system of FIG. 1.

FIG. 4 is a schematic front view of a second embodiment of the magnetic system utilized for NMR imaging.

DETAILED DESCRIPTION OF THE PREFERRED EMBODIMENTS

A magnetic system 11 employing the present invention is illustrated in FIGS. 1 and 2. Magnetic system 11 may be utilized in any environment where control of magnetic field strength and configuration is necessary or desirable. However, as illustrated in FIG. 2, this preferred embodiment is disclosed as being utilized in connection with NMR imaging.

Magnetic system 11, in this preferred embodiment, is shown as utilizing a pair of permanent magnets 13 and 15 as sources of the magnetic energy. It should be realized, however, that any suitable source of magnetic energy could be utilized, such as superconducting magnets or electromagnetic (resistive) magnets.

A first magnetic member 17 extends between one end of the permanent magnets 13 and 15, while a second magnetic member 19 extends between the other ends thereof. Magnetic members 17 and 19 are formed of a suitable ferromagnetic material and constitute opposed pole pieces. Thus, magnetic member 17 could connect the north poles of the permanent magnets 13 and 15, while the magnetic member 19 would then interconnect the south poles.

With this transverse arrangement, a magnetic path is established between the members 17 and 19 that is substantially confined to the air gap therebetween, thus minimizing the problem of stray or fringe fields. By providing the slight lip 21, by which the permanent magnets 13 and 15 extend beyond the pole pieces 17 and 19, confinement of the field to the magnetic structure is further enhanced.

A set of ferromagnetic bars 23 is mounted for longitudinal movement in the magnetic member 17. Bars 23 are formed of any suitable ferromagnetic material and are mounted to minimize the reluctance to magnetic flux flow between the magnetic member 17 and the ferromagnetic bars 23. To enhance the magnetic flux flow between magnetic member 17 and the ferromagnetic bars 23, a suitable ferro-fluid could be sealed between the bars and the magnetic member 17. The shape of bars 23 can be selected to yield the desired magnetic control, although round rods are utilized in the preferred embodiment disclosed herein.

A suitable driving device 25, such as an electromagnetic motor, is provided for each of the ferromagnetic bars 23. Control of the driving motors 25 is achieved by signals from a computer, this interconnection being schematically illustrated by the connectors 27.

In some applications, a single set of ferromagnetic bars may suffice, but in the preferred embodiment of FIG. 1, a second set of ferromagnetic bars 29 is mounted in the magnetic member 19. These ferromagnetic bars are mounted and driven in the same fashion as the ferromagnetic bars 23, and as in the case of ferromagnetic bars 23, ferromagnetic bars 29 are shown as round rods. In actual practice, it is anticipated that the ferromagnetic rods 25 and 29 would be significantly greater in number and hence mounted much closer than shown schematically in the drawing. The actual size, number and placement of the ferromagnetic rods 23 and 29 would depend upon the requirements of the system.

Use of the magnetic system of FIG. 1 in an NMR setting is illustrated in FIG. 2, where a coil schematically illustrated at 31 is utilized to provide the radio frequency perpendicular field and to pick up the resulting NMR signals. Application of the RF signals and transfer of the resulting NMR signals to the imaging computer is achieved through leads 33 and 35. A patient 37 is schematically illustrated as being mounted on a suitable support 39 within the coil 31. It is possible that in some cases the patient could be supported directly on the lower magnetic pole member, if a single set of ferromagnetic bars can provide the desired field characteristics.

Detection of the magnetic field in the magnetic system of FIG. 1 may be achieved by an array of Hall effect detectors 41 mounted in a suitable support plate 43. Signals from the Hall effect detectors may be conveyed for processing through a suitable line, such as shown at 45. Processing of the signals from the Hall effect detectors, to be utilized in controlling the driving motors 25, may be achieved in the same computer utilized to provide imaging for the NMR system.

In FIG. 4, a second embodiment is illustrated in which electromagnetic coils 47 are shown disposed around ferromagnetic bars 23', corresponding to ferromagnetic bars 23 in the FIG. 1 embodiment. By varying the current flow in coils 47, the magnetic flux flow through ferromagnetic bars 23' may be adjusted. Current flow in coils 47 is controlled by the computer provided with signals regarding the detected magnetic field.

Ferromagnetic bars 23' are mounted in a member 49, while ferromagnetic bars 29', corresponding to ferromagnetic bars 29 in FIG. 1, are mounted in a member 51. Members 49 and 51 are spaced by support members 53 and 55.

If all of the adjusting of the fields between members 49 and 51 is to be achieved through electromagnetic coils 47, which could also be placed about ferromagnetic bars 29', members 49 and 51 would be non-magnetic, as would the support members 53 and 55. However, if the electromagnetic coils 47 are merely used to aid in adjusting, then members 49 and 51 would correspond to magnetic members 17 and 19 in FIG. 1, and members 53 and 55 would correspond to the permanent magnets 13 and 15.

In the event that members 49 and 51 are non-magnetic, all of the magnetic energy would be provided by cois 47. As mentioned in connection with the embodiment of FIG. 1, a single set of ferromagnetic bars 23' with coils 47 might be sufficient to provide the desired field characteristics in some applications.

It should be understood that various modifications, changes and variations may be made in the arrangement, operation and details of construction of the elements disclosed herein without departing from the spirit and scope of this invention.

I claim:

1. A magnetic system to achieve a desired magnetic field configuration and strength in an air gap comprising:
    a source of magnetic energy;
    a first magnetically permeable member to establish a north magnetic pole on one side of the air gap;
    a second magnetically permeable member to establish a south magnetic pole on the other side of the air gap, said source of magnetic energy interconnecting said first and second magnetically permeable members;
    a set of a plurality of elongated ferromagnetic bars mounted in one of said pole members to convey magnetic flux to and from that pole member, said ferromagnetic bars extending into the air gap between said magnetically permeable members a distance less than the length of the air gap; and
    adjusting means to alter the magnitude of magnetic flux flow between said ferromagnetic bars and the other pole member to vary the magnetic field configuration and strength in the air gap to produce the desired magnetic field strength and configuration.

2. A magnetic system as claimed in claim 1 and further comprising a second set of a plurality of elongated ferromagnetic bars mounted in the other pole member to convey magnetic flux to and from that pole member.

3. A magnetic system as claimed in claim 2 wherein:
    said ferromagnetic bars in said first and second sets of ferromagnetic bars are mounted for longitudinal movement in, respectively, said first and second magnetic pole members; and
    said adjusting means comprises drive means to selectively move said ferromagnetic bars longitudinally.

4. A magnetic system as claimed in claim 1, 2 or 3 wherein said adjusting means comprises electromagnetic coils located about at least some of said ferromagnetic bars.

5. A magnetic system as claimed in claim 2 wherein said first and second sets of ferromagnetic bars each comprises a grid of substantially round rods substantially uniformly spaced over an area of the respective magnetic pole member.

6. A magnetic system as claimed in claim 1 and further comprising a ferro-fluid about said ferromagnetic bars to minimize magnetic reluctance between said magnetic pole member and said ferromagnetic bars.

7. A magnetic system as claimed in claim 1 wherein said source of magnetic energy comprises a permanent magnet.

8. A magnetic system as claimed in claim 1 wherein said ferromagnetic bars are positioned as close to one another as is mechanically feasible.

9. A magnetic system as claimed in claim 1 wherein said adjusting means may be utilized to focus the magnetic field on a desired relatively small area in the air gap.

10. A magnetic system for a nuclear magnetic resonance device used to analyze various types of objects comprising:
    a first generally horizontal magnetically permeable member;
    a second generally horizontal magnetically permeable member; spaced from said first magnetically permeable member with the object to be analyzed located between said magnetically permeable members;
    a source of magnetic energy interconnecting said first and second magnetically permeable members with said first and second magnetically permeable members at opposite magnetic polarities;
    a first set of a plurality of elongated ferromagnetic bars mounted for longitudinal movement in said first magnetically permeable member;
    a second set of a plurality of elongated ferromagnetic bars mounted for longitudinal movement in said second magnetic permeable member; and
    drive means for selectively moving said ferromagnetic bars to establish a desired magnetic field strength and configuration at the object being analyzed.

11. A magnetic system as claimed in claim 10 wherein said source of magnetic energy comprises:
    a first permanent magnet connected between a first end of said first magnetically permeable member and a first end of said second magnetically permeable member; and
    a second permanent magnet connected between a second end of said first magnetically permeable member and a second end of said second magnetically permeable member.

12. A magnetic system as claimed in claim 11 and further comprising electromagnetic coils located about at least some of said ferromagnetic bars.

13. A magnetic system for a nuclear magnetic resonance diagnostic device comprising:
    a first magnetic source having a north magnetic pole at one end and a south magnetic pole at the other end;
    a second magnetic source having a north magnetic pole at one end and a south magnetic pole at the other end;
    a first magnetically permeable member interconnecting the north magnetic poles of said first and second magnetic sources;
    a second magnetically permeable member interconnecting the south magnetic poles of said first and second magnetic sources, a patient to be diagnosed located between said first and second magnetically permeable members;
    a first set of a plurality of elongated ferromagnetic bars mounted in said first magnetically permeable member for longitudinal movement and to convey magnetic flux to and from said first magnetically permeable member, said ferromagnetic bars being mounted as close to one another as is mechanically feasible;
    a second set of a plurality of elongated ferromagnetic bars mounted in said second magnetically permeable member for longitudinal movement and to convey magnetic flux to and from said second magnetically permeable member, said ferromagnetic bars being mounted as close to one another as is mechanically feasible; and drive means for selectively moving said ferromagnetic bars to establish a desired magnetic field strength and configuration at the position of the patient being diagnosed.

14. A magnetic system as claimed in claim 13 wherein said first and second magnetic sources are permanent magnets.

15. A magnetic system as claimed in claim 13 and further comprising electromagnetic coils located about at least some of said ferromagnetic bars to aid in adjusting the magnetically permeable field between said first and second magnetic members.

16. A magnetic system as claimed in claim 13 and further comprising:
    detection means to ascertain magnetic field strength at a predetermined location between said first and second magnetically permeable members; and
    control means responsive to said detection means to actuate said drive means to selectively move one or more of said ferromagnetic bars to produce a desired magnetic field strength at said predetermined location.

17. A magnetic system to achieve a desired magnetic field configuration and strength in an air gap comprising:
    a first non-magnetic member;
    a set of elongated ferromagnetic bars mounted in said first non-magnetic member;
    magnetically permeable means spaced from the ends of said ferromagnetic bars to form the air gap between the ends of said ferromagnetic bars and said magnetically permeable means; and
    electromagnetic coils located about at least some of said ferromagnetic bars.

18. A magnetic system as claimed in claim 17 wherein said magnetically permeable means comprises:
    a second non-magnetic member spaced from said first non-magnetic member; and
    a second set of elongated ferromagnetic bars mounted in said second non-magnetic member and extending toward said first set of ferromagnetic bars.

* * * * *